United States Patent [19]

Uehara et al.

[11] Patent Number: 4,577,165

[45] Date of Patent: Mar. 18, 1986

[54] HIGH-FREQUENCY OSCILLATOR WITH POWER AMPLIFIER AND AUTOMATIC POWER CONTROL

[75] Inventors: Akira Uehara; Takashi Uehara, both of Kanagawa; Miyuki Saito, Saitama; Toshiyuki Ishida, Tokyo, all of Japan

[73] Assignee: Tokyo Denshi Kagaku Co., Ltd., Kanagawa, Japan

[21] Appl. No.: 580,853

[22] Filed: Feb. 16, 1984

[30] Foreign Application Priority Data

Feb. 22, 1983 [JP] Japan .................................. 58-28195
Feb. 22, 1983 [JP] Japan .................................. 58-28196

[51] Int. Cl.$^4$ .......................... H03B 5/36; H03L 5/02
[52] U.S. Cl. ................................ 331/109; 331/116 R; 331/183
[58] Field of Search ............. 331/109, 116 R, 116 FE, 331/158, 159, 183, 182; 315/111.21, 111.51

[56] References Cited

U.S. PATENT DOCUMENTS 3,134,947 5/1964 Charasz .......................... 331/183 X

FOREIGN PATENT DOCUMENTS 55-143841 11/1980 Japan .................................. 331/183

OTHER PUBLICATIONS

Greiner et al., "RF Sputtering Technique", IBM Technical Disclosure Bulletin, vol. 17, No. 7, Dec. 1974, pp. 2172–2173.

Primary Examiner—Siegfried H. Grimm
Attorney, Agent, or Firm—Irving M. Weiner; Joseph P. Carrier; John J. Cantarella

[57] ABSTRACT

A high-frequency oscillator including an oscillation circuit (1) having a quartz crystal (X) and an amplifying element ($Q_2$), a power amplifying circuit (3) for amplifying the output of the oscillation circuit, and a control system ($Q_7$, 6) for varying a bias voltage of the amplifying element to thereby control the output power of the power amplification circuit. The control system comprises an FET ($Q_7$) connected at the drain thereof to the amplifying element, and a control circuit (6) for applying a control signal to the gate of the FET.

7 Claims, 4 Drawing Figures

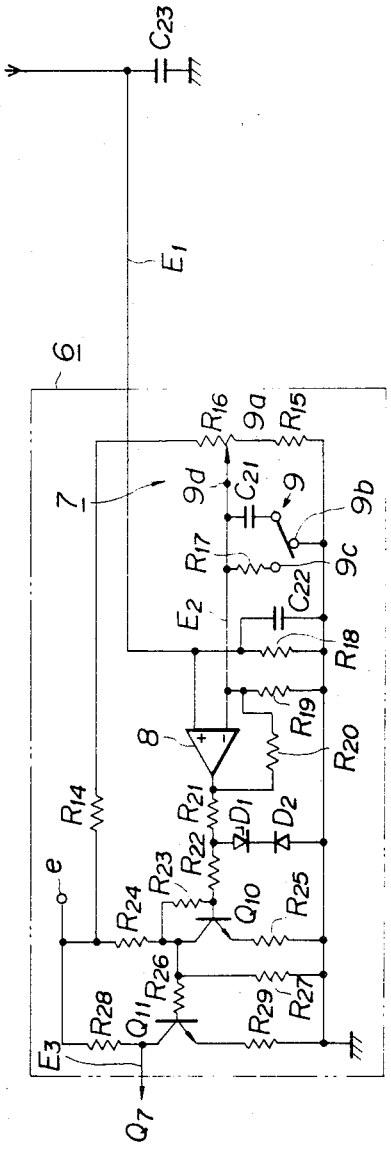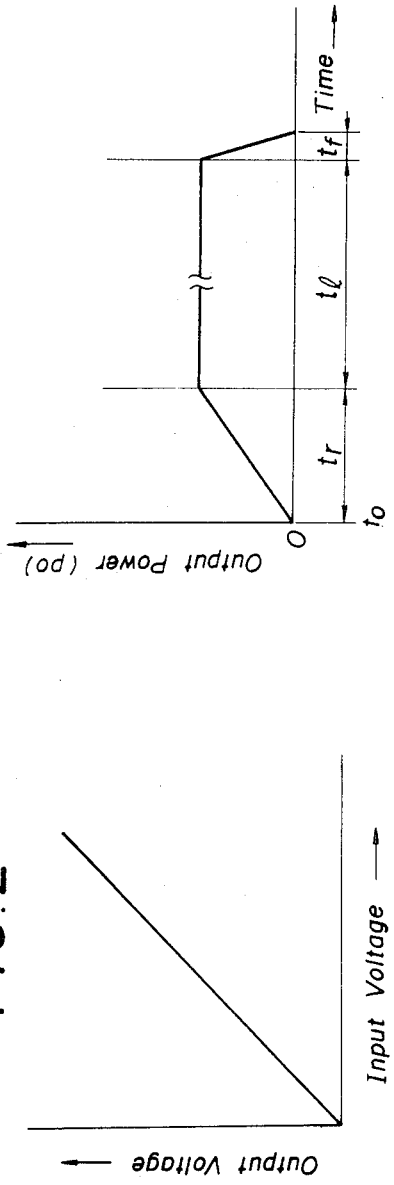
FIG. 3
FIG. 4
FIG. 2

HIGH-FREQUENCY OSCILLATOR WITH POWER AMPLIFIER AND AUTOMATIC POWER CONTROL

BACKGROUND OF THE INVENTION

1. Field of the Invention

The present invention relates generally to a high-frequency oscillator. More particularly, the invention relates to a high-frequency oscillator of high output for generating plasma to be used in a plasma etching process.

2. Description of Relevant Art

Recently, as one of the most important techniques for the production of integrated circuits, there has been utilized an etching technique using plasma, in which a pressure-reduced gaseous body is caused to discharge by an electric field of high frequency to generate low-temperature plasma containing chemically active species (atom, molecule, ion). A surface of a wafer is thereby etched to be processed by taking advantage of the fact that a chemical reaction between the active species and the surface layer produces a substance of high vapor pressure.

For such etching technique, there has been employed a high-frequency oscillator, in which a high-frequency wave of 13.56 MHz is generated in a quartz oscillating circuit and amplified by means of a transistor or, when a large output of power is required, by a vacuum tube. From a small power output of 100 W, there is thereby obtained a high-frequency large-power output exceeding 1 kW.

In fabricating a high-output oscillator requiring large-power amplification, a vacuum tube is generally employed. However, the vacuum tube has as a basic shortcoming thereof a relatively short service life and, in normal use, requires readjustment or replacement after the lapse of only thousands of hours, thereby creating a major obstacle in the etching process.

On the other hand, although free of the service life problems of the vacuum tube, the transistor, or more generally the semiconductor device for amplification, has had attendant technical difficulties in the adaptation thereof as a high-frequency element for high voltage and high output, besides having a weak point of secondary breakdown, and has proven unsuitable for power amplification. The more recently developed MOS FET (metal-oxide semiconductor type field effect transistor), on the other hand, has put to practical use a high-performance solid-state element which can serve for high-frequency high output without the secondary breakdown attendant ordinary transistors, and is highly suitable for large-power usage.

The high-frequency oscillator employed in the art of plasma etching must meet various performance requirements, such as handling high-frequency waves, particularly of ten-odd mega-hertz, and large power outputs reaching a number of kilowatts, as well as generating stable sine waves of high accuracy and easily and widely varying the output power thereunder. However, there have been no proposed high-frequency oscillators sufficiently satisfying such requirements by employing an MOS FET adapted for large power.

Moreover, in an etching process in which a high-frequency voltage is applied to a gaseous body enclosed in a reactor, at certain levels of the high-frequency voltage a structural defect may be caused in a workpiece such as a silicon wafer being processed, due to the application manner of the high-frequency voltage. In this respect, a desideratum has developed for an effective measure for the application of high-frequency voltage.

The present invention effectively fulfills the aforesaid desideratum.

SUMMARY OF THE INVENTION

According to the present invention, there is provided a high-frequency oscillator comprising an oscillation circuit having a high-frequency oscillatory element and an amplifying element for amplifying the output of the oscillatory element, a power amplification circuit for amplifying the power of a high-frequency output of the oscillation circuit, and a control system for varying a bias voltage of the amplifying element to thereby control the output power of the power amplification circuit. The control system has a field effect transistor connected at the drain thereof to the amplifying element, and a control circuit is provided for applying a direct-current control signal to the gate of the field effect transistor.

It is an object of the present invention to provide, particularly in the art of plasma etching, a high-frequency oscillator adapted for high-frequency high output, while permitting an accurate, easy, and wide control of output power.

Another object of the present invention is to provide a high-frequency oscillator suitable for the generation of plasma and capable of a so-called "soft start" which effectively prevents sudden application of high-frequency voltage.

The above and further objects, features and advantages of the present invention will become more fully apparent from the following detailed description of the preferred embodiments of the invention when the same is read in conjunction with the accompanying drawings.

BRIEF DESCRIPTION OF THE DRAWINGS

FIG. 2 is a characteristic curve of a field effect transistor of the high-frequency oscillator of FIG. 1.

FIG. 3 is a circuit diagram of a control circuit of the high-frequency oscillator of FIG. 1.

FIG. 4 is an output characteristic curve of the high-frequency oscillator of FIG. 1.

DETAILED DESCRIPTION OF PREFERRED EMBODIMENTS

Figure 1:
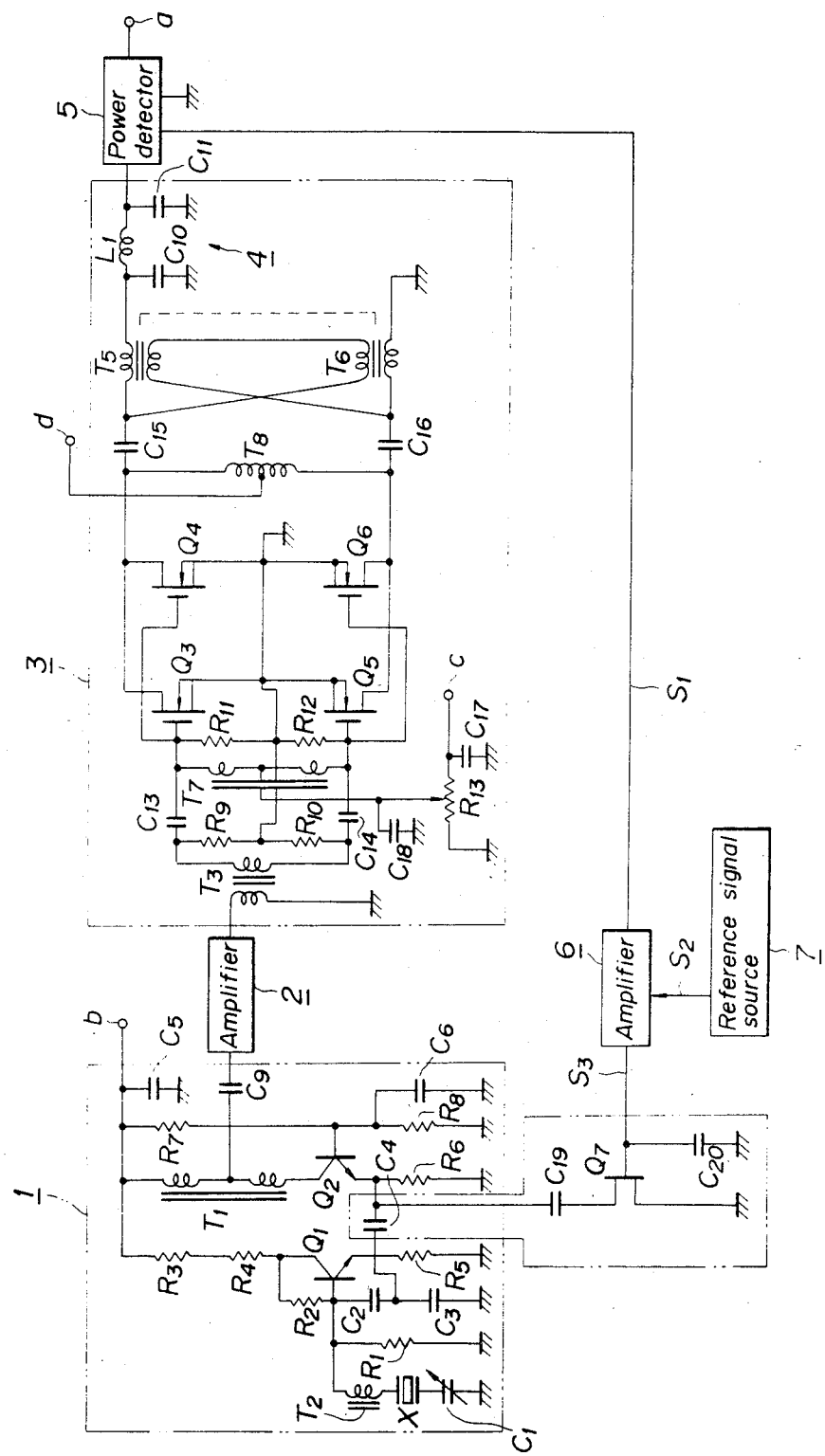
FIG. 1 is a circuit diagram of a high-frequency oscillator according to the invention.

Referring first to FIG. 1, designated at reference numeral 1 is an oscillation circuit. The oscillation circuit 1 comprises a quartz oscillation circuit with first and second non-type high-frequency transistors $Q_1$, $Q_2$ grounded in a common-emitter manner and a common-base manner and a quartz crystal X connected to the base of the first transistor $Q_1$, and has a high-frequency wave of 13.56 MHz generated at the quartz crystal X and amplified through the transistors $Q_1$, $Q_2$ before being taken out as an output signal of the oscillation circuit 1 from an output transformer $T_1$ to which the second transistor $Q_2$ is connected at the collector thereof. The oscillation circuit 1 includes a variable condenser $C_1$ for adjustment and another transformer $T_2$, both connected as oscillatory elements in series with the quartz crystal X, in addition to a plurality of bias resistors $R_1$ to $R_8$ for biasing the transistor $Q_1$ or $Q_2$ and a plurality of bypass condensers $C_2$, $C_3$, $C_5$ and $C_6$, and a coupling condenser $C_4$ for coupling the transistors $Q_1$, $Q_2$, the resistors and condensers being selected in accordance with the desired design characteristics.

It is to be noted that high-frequency oscillators oriented to the service of plasma generation are generally required to provide a stable high-frequency wave consisting of a sinusoidal waveform having a small distortion factor to assure the high accuracy needed in the processing of work-pieces, and to have a widely variable output power to fulfill particular service requirements. For this purpose, in this embodiment of the invention, besides the provision of the coupling condenser $C_4$ between respective emitters of the transistors $Q_1$, $Q_2$, a control signal is applied in the form of a direct-current voltage as an output of a later-described control FET (field effect transistor) to the emitter of the transistor $Q_2$, thereby holding the output of the oscillation circuit 1 in a sine wave of high accuracy, while rendering the output voltage easily and exactly variable. Consequently, with the variable direct-current voltage applied to the emitter of the transistor $Q_2$, the output of the oscillation circuit 1 at a coupling condenser $C_9$ is made variable.

The condenser $C_9$ is connected to the input end of an amplifier 2, which is in turn connected at the output end thereof to a power amplification circuit 3, thus feeding the power amplification circuit 3 with the output of the oscillation circuit 1 as amplified through the amplifier 2.

The power amplification circuit 3 has a high-frequency voltage input through an inverting input transformer $T_3$ and applied to two pairs of high-output MOS FET's $Q_3$, $Q_4$; $Q_5$, $Q_6$ of equal characteristics, which FET's $Q_3$, $Q_4$; $Q_5$, $Q_6$ are connected in parallel in each pair and in a push-pull manner as a whole to enlarge the power capacity, and are adapted for a class AB action to obtain a low distortion factor, whereby a high-frequency power as amplified is output at a pair of output transformers $T_5$, $T_6$. Such output power is introduced through a matching circuit 4, which is constituted in a $\pi$ form with a coil $L_1$ and a pair of condensers $C_{10}$, $C_{11}$, and a power detector 5, to an output terminal a, which may be connected to a reactor (not shown) for plasma etching provided as a load in the front stage thereof with an automatic matching circuit (not shown).

With respect to the power amplification circuit 3, designated in FIG. 1 at reference characters $R_9$ to $R_{12}$ are input resistors; $C_{13}$ to $C_{16}$ are coupling condensers; and $T_7$ and $T_8$ are bias transformers, while a bias control circuit comprises a variable resistor $R_{13}$ and a pair of condensers $C_{17}$, $C_{18}$. These circuit elements may be selected in accordance with the desired design characteristics.

The power detector 5 is connected to a feedback amplification circuit 6 as a control circuit, thus feeding the circuit 6 with a converted direct-current signal $S_1$ proportional to the output power of the power amplification circuit 3. The circuit 6 is adapted to compare the converted signal $S_1$ with a predetermined reference signal $S_2$, to output a direct-current control signal $S_3$ in accordance with the difference between the signals $S_1$, $S_2$.

The feedback amplification circuit 6 is connected at the output end thereof to the gate of a control FET $Q_7$, thus feeding the control signal $S_3$ to the FET $Q_7$, which has an excellent linearity of output (drain) voltage to input (gate) voltage characteristic as shown in FIG. 2.

The FET $Q_7$ is directly grounded at the source thereof and connected at the drain thereof through a coupling condenser $C_{19}$ to the emitter of the second transistor $Q_2$ in an amplifying stage of the oscillation circuit 1, which amplifying stage is arranged to be variable in the bias voltage thereof in proportion to the output (drain) voltage of the FET $Q_7$ so that, when the potential difference between the drain and gate of the FET $Q_7$ is varied from zero to 5 V for example, the output voltage of the oscillation circuit 1 varies proportionally from a minimum level up to a maximum level.

Also designated in FIG. 1 is a bypass condenser $C_{20}$, and input terminals b, c and d from a direct-current power source (not shown).

With the foregoing arrangement, there is favorably effected a feedback control by way of a closed loop for controlling to hold constant the output power, whereas the feedback amplification circuit 6 is provided with a reference signal source 7 for feeding the reference signal $S_2$ to the circuit 6. In this respect, there may be employed a modified arrangement in which a reference signal is varied by a program or other suitable means to control the potential difference between the drain and gate of an FET $Q_7$, thus permitting an accurate, easy, and stable control of the output power of the high-frequency oscillator by way of an open loop.

Referring now to FIG. 3, the feedback amplification circuit 6 comprises the reference signal source 7 comprising a pair of fixed resistors $R_{14}$, $R_{15}$ and a variable resistor $R_{16}$; a differential amplifier 8 for comparing a converted direct-current voltage $E_1$ as the converted signal $S_1$ with a reference voltage $E_2$ as the reference signal $S_2$ given from the reference signal source 7 and for amplifying the difference therebetween; and a pair of transistors $Q_{10}$, $Q_{11}$ for further amplifying the output of the differential amplifier 8. When the output power as detected at the power detector 5 is caused to exceed a rated value, the converted voltage $E_1$ becomes larger than the reference voltage $E_2$ preset at the resistor $R_{16}$, thus giving a control voltage $E_3$ as the control signal $S_3$ in proportion to the difference between the voltages $E_1$, $E_2$, thereby reducing the output power of the high-frequency oscillator.

The feedback amplification circuit 6 further comprises a start switch 9 which has a mobile contact 9a connected through a condenser $C_{21}$ to a sliding terminal 9d of the variable resistor $R_{16}$, a first stationary contact 9b grounded, and a second stationary contact 9c connected through a resistor $R_{17}$ to the sliding terminal 9d. As a starting switch for generating plasma, the start switch 9 is adapted, in an OFF state thereof in which the second stationary contact 9c is selected, to discharge to render zero the electric charge stored in the condenser $C_{21}$. When generating plasma, the switch 9 is changed over to an ON state thereof in which the first stationary contact 9b is selected. After the changeover, a charging current is conducted from a direct-current power source terminal e through the resistor $R_{14}$ and the resistor $R_{16}$ to the condenser $C_{21}$, the initially stored charge of which is zero. Thus, the potential difference across the condenser $C_{21}$ is gradually increased in accordance with a time constant depending on the resistors $R_{14}$, $R_{16}$ and the condenser $C_{21}$. As a result, the reference voltage $E_2$ constituting one of two input signals of the differential amplifier 8 gradually increases from zero, and the control voltage $E_3$ as an output of the amplification circuit 6 varies in correspondence therewith, likewise changing the gate voltage of the FET $Q_7$. The output power of the high-frequency oscillator is thus caused to gradually increase with time from a minimum value to a maximum constant value at which the oscillator enters a stationary state in which the output power is kept at the constant or rated value as described hereinabove.

On the contrary, when cutting-off the power supply to the reactor, the switch 9 is returned to the second stationary contact 9c, thereby causing the condenser $C_{21}$ to start discharging the electric charge through the resistor $R_{17}$, following a discharging characteristic which depends on a time constant established by the condenser $C_{21}$ and the resistor $R_{17}$.

FIG. 4 depicts a characteristic curve showing the variation the output power of the oscillator will take as time passes after the start switch 9 is turned ON. The output power PO, though being zero at the time $t_o$ when the switch 9 is turned ON, is caused to increase with time, reaching the aforementioned constant value after the lapse of a rising time $t_r$. The output power PO remains in the stationary state for a predetermined or selectively-set time period $t_l$ and, when the switch 9 is reset to the OFF state, starts decreasing with time following the discharging characteristic, thus falling to zero after the lapse of a falling time $t_f$, while the falling time $t_f$ is shorter than the rising time $t_r$.

With respect to the amplifying circuit 6, designated in FIG. 3 at reference characters $D_1$ and $D_2$ are a voltage-restricting zener diode and a silicon diode, respectively; $R_{18}$, $R_{29}$ are resistors; and $C_{22}$, $C_{23}$ are condensers. Such circuit elements may be selected in accordance with the desired design characteristics.

It is to be noted that in a conventional high-frequency oscillator in which a feedback circuit is provided for a feedback control to stabilize the output power without a start switch as associated with a time-constant circuit, when switched on, the output power has to be increased to a large value in a very short time and supplied as it is to a certain load.

As will be understood from the foregoing description, in a high-frequency oscillator according to the present embodiment of the invention, an FET is provided to vary with the drain voltage thereof the bias of an amplifying element of an oscillation circuit, for thereby controlling the output of the oscillator with a direct-current signal applied to the gate of the FET. There is thus permitted an accurate, easy, and wide output power control under a stable function. In addition, by favorably employing an MOS FET in a power amplification stage, the faulty short service life, which might otherwise be encountered in a high-frequency oscillator for plasma etching, is successfully avoided.

Moreover, with a sort of self-control function adapted to serve, when generating plasma, to gradually increase the output power of the oscillator from a minimum value to a stationary value, a stable plasma generation is made possible, thus successfully preventing the structural defects which might otherwise appear in the workpiece to be processed during the initial stage of plasma generation, whereby a high-quality plasma etching may be attained.

Although there have been described what are at present considered to be the preferred embodiments of the invention, it will be understood that the present invention may be embodied in other specific forms without departing from the spirit or essential characteristics thereof. The present embodiments are therefore to be considered in all respects as illustrative and not restrictive. The scope of the invention is indicated by the appended claims rather than by the foregoing description.

We claim:

1. A high-frequency oscillator, comprising:
   an oscillation circuit (1) having a high-frequency oscillatory element (X) and an amplifying element ($Q_2$) for amplifying the output of said oscillatory element;
   a power amplification circuit (3) for amplifying the power of a high-frequency output of said oscillation circuit;
   control means ($Q_7$, 6) for varying a bias voltage of said amplifying element to thereby control the output power of said power amplification circuit;
   said control means having a field effect transistor ($Q_7$) connected at the drain thereof to said amplifying element and a control circuit (6) for applying a direct-current control signal ($S_3$) to the gate of said field effect transistor;
   said control means further has a power detector (5) for detecting said output power of said power amplification circuit to give a converted direct-current signal ($S_1$) according thereto, and a reference signal source (7) for giving a predetermined reference signal ($S_2$) while it is continuously energized;
   said control circuit comprises an amplifier (6) for amplifying the difference between said converted signal and said reference signal to produce said control signal; and
   said reference signal source is adapted to cause, in the initial stage of energization thereof, said reference signal to rise with a predetermined time-constant.

2. A high-frequency oscillator, comprising:
   an oscillation circuit (1) having a high-frequency oscillatory element (X) and an amplifying element ($Q_2$) for amplifying the output of said oscillatory element;
   a power amplification circuit (3) for amplifying the power of a high-frequency output of said oscillation circuit;
   control means ($Q_7$, 6) for varying a bias voltage of said amplifying element to thereby control the output power of said power amplification circuit;
   said control means having a field effect transistor ($Q_7$) connected at the drain thereof to said amplifying element and a control circuit (6) for applying a direct-current control signal ($S_3$) to the gate of said field effect transistor;
   said control means further has a power detector (5) for detecting said output power of said power amplification circuit to give a converted direct-current signal ($S_1$) according thereto, and a reference signal souce (7) for giving a predetermined reference signal ($S_2$) while it is continuously energized;
   said control circuit comprises an amplifier (6) for amplifying the difference between said converted signal and said reference signal to produce said control signal; and
   said reference signal source is adapted to cause, in the closing stage of energization thereof, said reference signal to fall with a predetermined time-constant.

3. A high-frequency oscillator, comprising:
   an oscillation circuit (1) having a high-frequency oscillatory element (X) and amplifying element ($Q_2$) for amplifying the output of said oscillatory element;

a power amplification circuit (3) for amplifying the power of a high-frequency output of said oscillation circuit;

control means ($Q_7$, 6) for varying a bias voltage of said amplifying element to thereby control the output power of said power amplification circuit;

said control means having a field effect transistor ($Q_7$) connected at the drain thereof to said amplifying element and a control circuit (6) for applying a direct-current control signal ($S_3$) to the gate of said field effect transistor;

said power amplification circuit comprises a metal-oxide semi-conductor type field effect transistor ($Q_3$, $Q_4$, $Q_5$, $Q_6$);

said control means further has a power detector (5) for detecting said output power of said power amplification circuit to give a converted direct-current signal ($S_1$) according thereto, and a reference signal source (7) for giving a predetermined reference signal ($S_2$) while it is continuously energized; and said control circuit comprises an amplifier (6) for amplifying the difference between said converted signal and said reference signal to produce said control signal.

4. A high-frequency oscillator according to claim 3, wherein:

said output power of said power amplification circuit is variable between a minimum value and a stationary value in accordance with said control signal.

5. A high-frequency oscillator according to claim 4, wherein:

said control signal is relatively slow in the speed of variation thereof.

6. A high-frequency oscillator according to claim 3, wherein:

said reference signal source is adapted to cause, in the initial stage of energization thereof, said reference signal to rise with a predetermined time-constant.

7. A high-frequency oscillator according to claim 3, wherein:

said reference signal source is adapted to cause, in the closing stage of energization thereof, said reference signal to fall with a predetermined time constant.

* * * * *